(12) United States Patent
Kadow et al.

(10) Patent No.: US 9,450,019 B2
(45) Date of Patent: Sep. 20, 2016

(54) POWER SEMICONDUCTOR DEVICE, MANUFACTURING METHOD THEREFOR, AND METHOD FOR OPERATING THE POWER SEMICONDUCTOR DEVICE

(71) Applicant: Infineon Technologies AG, Neubiberg (DE)

(72) Inventors: Christoph Kadow, Gauting (DE); Marc Strasser, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 102 days.

(21) Appl. No.: 14/303,654

(22) Filed: Jun. 13, 2014

(65) Prior Publication Data

US 2015/0364524 A1 Dec. 17, 2015

(51) Int. Cl.
| | |
|---|---|
| H01L 35/00 | (2006.01) |
| H01L 37/00 | (2006.01) |
| H03K 3/42 | (2006.01) |
| H03K 17/78 | (2006.01) |
| H01L 27/16 | (2006.01) |
| H01L 21/768 | (2006.01) |
| G01K 7/01 | (2006.01) |
| G01K 1/02 | (2006.01) |

(52) U.S. Cl.
CPC ............... *H01L 27/16* (2013.01); *G01K 1/026* (2013.01); *G01K 7/01* (2013.01); *H01L 21/76895* (2013.01); *G01K 2217/00* (2013.01)

(58) Field of Classification Search
CPC ........ G01K 7/01; G01K 3/005; G01K 7/015; G05F 3/30; H01L 23/34
USPC ................................ 327/512, 513, 565, 566
See application file for complete search history.

(56) References Cited

U.S. PATENT DOCUMENTS

| | | | |
|---|---|---|---|
| 8,169,045 B2 | 5/2012 | Dibra et al. | |
| 8,766,704 B2 * | 7/2014 | Takayanagi | 327/513 |
| 2006/0082523 A1 * | 4/2006 | Guo et al. | 345/76 |
| 2008/0036445 A1 | 2/2008 | Meyer et al. | |
| 2008/0204125 A1 * | 8/2008 | Lee et al. | 327/544 |
| 2008/0237772 A1 | 10/2008 | Stecher et al. | |
| 2015/0071323 A1 * | 3/2015 | Lee et al. | 374/45 |

* cited by examiner

*Primary Examiner* — Quan Tra
(74) *Attorney, Agent, or Firm* — Murphy, Bilak & Homiller, PLLC

(57) ABSTRACT

A power semiconductor device includes a semiconductor body including a first surface, an edge delimiting the semiconductor body in a horizontal direction substantially parallel to the first surface, an active area including at least one of several transistor structures connected in parallel and several diode structures connected in parallel, and a peripheral area arranged between the active area and the edge. The power semiconductor further device includes a plurality of word lines, a plurality of bit lines separated from the word lines, and a plurality of temperature sensors arranged on or at the first surface, wherein each of the temperature sensors is connected with one of the bit lines and one of the word lines or each of the temperature sensors is formed by a respective portion of one of the bit lines.

20 Claims, 8 Drawing Sheets

US 9,450,019 B2

POWER SEMICONDUCTOR DEVICE, MANUFACTURING METHOD THEREFOR, AND METHOD FOR OPERATING THE POWER SEMICONDUCTOR DEVICE

TECHNICAL FIELD

Embodiments of the present invention relate to power semiconductor devices, in particular to power semiconductor transistors, a method for operating power semiconductor devices and a method for producing power semiconductor devices.

BACKGROUND

Power semiconductor devices, in particular power field-effect controlled switching devices such as a Metal Oxide Semiconductor Field Effect Transistor (MOSFET) and an Insulated Gate Bipolar Transistor (IGBT) have been used for various applications including but not limited to use as switches in power supplies and power converters, electric cars, air-conditioners, and even stereo systems.

Due to the typically large currents flowing through the semiconductor body of the power devices during device operation, the corresponding power dissipation may heat up the semiconductor body to temperatures of more than 150° C. These high temperatures may shift the characteristics of the power devices and may even result in a degradation or destruction of the power devices when occurring for longer times. Measuring the temperature of power semiconductor devices is therefore often desired to optimize device performance and/or to prevent damaging effects.

For these and other reasons, there is a need for the present invention.

SUMMARY

According to an embodiment of a power semiconductor device, the power semiconductor device includes a semiconductor body including a first surface, an edge delimiting the semiconductor body in a horizontal direction substantially parallel to the first surface, an active area including at least one of several transistor structures connected in parallel and several diode structures connected in parallel, and a peripheral area arranged between the active area and the edge. The power semiconductor further device includes a plurality of word lines, a plurality of bit lines separated from the word lines, and a plurality of temperature sensors arranged on or at the first surface. Each of the temperature sensors is connected with one of the bit lines and one of the word lines or formed by a respective portion of one of the bit lines.

According to an embodiment of a method for operating a power semiconductor device including a first load metallization, a second load metallization, a plurality of individually addressable temperature sensors, and a semiconductor body having a first surface and including at least one of a plurality of transistor structures connected in parallel between the first load metallization and the second load metallization and several diode structures connected in parallel between the first load metallization and the second load metallization, the method includes measuring a temperature distribution using the individually addressable temperature sensors and controlling a load current between the first load metallization and the second load metallization in accordance with the measured temperature distribution.

According to an embodiment of a method for producing a power semiconductor device, the method includes: providing a semiconductor wafer having a first surface; defining an active chip area and a peripheral chip area surrounding the active chip area; forming in the active chip area at least one of a plurality of transistor structures and a plurality of diode structures; forming a plurality of temperature sensors on the first surface; forming on the first surface a first load metallization in ohmic contact with the transistor structures and/or the diode structures; forming a second load metallization in ohmic contact with the transistor structures and/or the diode structures; forming a plurality of word lines on the first surface; and forming a plurality of bit lines on the first surface, so that each of the temperature sensors is connected with one of the bit lines and one of the word lines or that each of the temperature sensors is formed by a respective portion of one of the bit lines.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
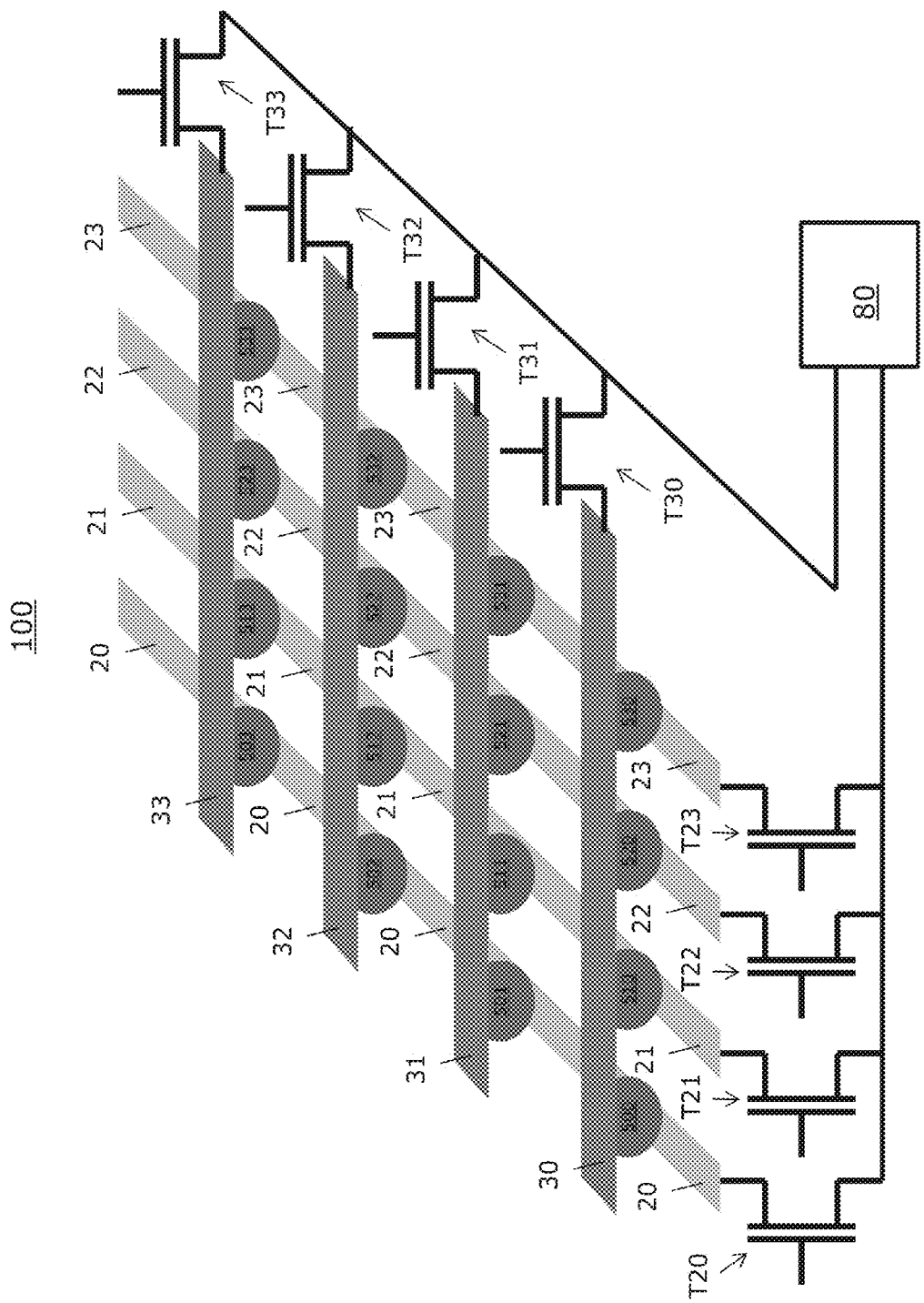
FIG. 1 illustrates a schematic view of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as a first conductivity type while p-doped is referred to as a second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n−" means a doping concentration which is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n+-doping regions can have different absolute doping concentrations. The same applies, for example, to an n+-doping and a p+-doping region.

Specific embodiments described in this specification pertain to, without being limited thereto, to power semiconductor devices, in particular to power field effect semiconductor transistors and manufacturing methods therefor. Within this specification the terms "semiconductor device" and "semiconductor component" are used synonymously.

The term "power semiconductor device" as used in this specification intends to describe a semiconductor device on a single chip with high voltage and/or high current switching capabilities. In other words, power semiconductor devices are intended for high current, typically in the Ampere range. Within this specification, the terms "power semiconductor device" and "power semiconductor component" are used synonymously.

Typically, the power semiconductor device is a power diode having an active area with a plurality diode-cells or a power transistor having an active area with a plurality of IGBT-cells or MOSFET-cells for carrying and/or controlling a load current between two load metallizations. The two load metallizations may be arranged on the main surface (lateral power device configured to conduct current substantially parallel to the main surface) or opposite to each other (vertical power device configured to conduct current substantially perpendicular to the main surface).

In embodiments referring to vertical power semiconductor devices, at least one edge-termination structure is typically arranged in a peripheral area surrounding the active area when seen from above.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region or a collector region respectively. The drain region or the collector region is in low resistive electric contact with a drain or collector electrode. The source region or emitter region is in low resistive electric contact with a source or emitter electrode.

In the context of the present specification, the terms "in Ohmic contact", "in resistive electric contact" and "in resistive electric connection" intend to describe that there is a resistive current path between respective elements or portions of a semiconductor device at least when no voltages are applied to and/or across the semiconductor device. Likewise, the terms "in low resistive electric contact" and "in low resistive electric connection" intend to describe that there is a low resistive current path between respective elements or portions of a semiconductor device at least when no voltages are applied to and/or across the semiconductor device. Within this specification the terms "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used as a more general term than IGFET (insulated-gate field-effect transistor) and MISFET (metal-insulator-semiconductor field-effect transistor), respectively.

In the context of the present specification, the term "gate electrode" intends to describe an electrode which is situated next to, and insulated from, the body region and configured to form and/or control a channel region through the body region.

In the context of the present specification, the term "field electrode" intends to describe an electrode which is arranged next to a semiconductor region, typically the drift region, is insulated from the semiconductor region and the semiconductor body, respectively, and is configured to expand a depleted portion in the semiconductor region by charging to an appropriate voltage with regard to the surrounding semiconductor region, i.e., typically a negative voltage for an n-type semiconductor region.

Typically, the field electrode is formed by a conductive region, arranged in or on the semiconductor body and is insulated from the semiconductor body by an insulating region forming a field dielectric region. During the blocking mode, charges, typically negative charges for an n-type semiconductor region adjoin the insulating region, so that a portion of the semiconductor region is depleted by the charges. The conductive region may be made of a material with high enough electric conductivity so that the conductive region forms an equipotential region during device operation. For example, the conductive region may be made of a material with metallic or near-metallic electric conductivity such as a metal, for example wolfram (i.e., tungsten), highly doped poly-silicon, a silicide or the like. Typically, the conductive region is in resistive electric connection with a gate metallization of the semiconductor device. Furthermore, only a portion of the conductive region may form a field electrode while another portion may form the gate electrode of the field-effect structure. The insulating region may be made of any suitable dielectric material such as silicon oxide, for example thermal silicon oxide, silicon nitride, siliconoxynitride or the like.

In the context of the present specification, the term "mesa" or "mesa region" intends to describe a semiconductor region between two adjacent trenches extending into the semiconductor substrate or body in a vertical cross-section.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance $R_{on}$ in the following also referred to as on-resistance $R_{on}$.

With reference to FIG. 1, a first embodiment of a power semiconductor device 100 is explained. FIG. 1 illustrates a schematic view of the semiconductor device 100. The semiconductor device 100 includes a semiconductor body (not shown in FIG. 1) with a first surface (main surface, not shown in FIG. 1). A plurality of temperature sensors 500 to 533 are arranged on the first surface. Each of the temperature sensors 500 to 533 is connected with one of the bit lines 20 to 23 and one of the word lines 30 to 33 arranged on the first surface and separated from the bit lines 20 to 23, e.g. by a dielectric layer (not shown in FIG. 1). Typically, the bit lines 20 to 23 are arranged in a first plane parallel to the first surface and the word lines 30 to 33 are arranged in a second plane parallel to the first surface and are spaced apart from the first plane.

The semiconductor device 100 may be a power transistor, for example a power MOSFET, a power IGBT or power bipolar transistor, with a plurality of respective transistor structures formed in the semiconductor body and connected in parallel to each other (and between a first load metallization and a second load metallization which are not shown in FIG. 1, e.g. a source metallization and a drain metallization for a power MOSFET), or a power diode with a plurality of diode structures formed in the semiconductor body and connected in parallel to each other.

Due to the temperature sensors 500 to 533, the temperature distribution of the power semiconductor device 100 may be measured with good spatial and temporal resolution during device operation. In the exemplary embodiment, the temperature sensors 500 to 533 form a regular array on the semiconductor body. For example, on each of the transistor structures (or diode structure) one of the temperature sensors 500 to 533 may be formed. Accordingly, the temperature of each of the transistor structures (or diode structure) may be monitored during device operation.

Due to using crossing word-lines 30 to 33 and bit-lines 20 to 23, the wiring complexity is low and only a small number of select transistors T20 to T23 (first select transistors) connected to the bit lines 20 to 23, and T30 to T33 (second select transistors) connected to the word lines 30 to 33 is required.

The select transistors T20 to T23 and T30 to T33 may be integrated into the semiconductor body of the semiconductor device 100, for example in a peripheral area of the semiconductor body. Accordingly, the external wiring is kept simple.

As illustrated in FIG. 1, each of the select transistors T20 to T23 and T30 to T33 is typically switched between an evaluation circuitry 80 and either a respective bit line 20 to 23 or a respective word line 30 to 33. For example, the source electrode of each of the first select transistors T20 to T23 and each of the second select transistors T30 to T33 is connected with the evaluation circuitry 80, and the drain electrode of each of the first select transistors T20 to T23 and each of the second select transistors T30 to T33 is connected with a corresponding bit line 20 to 23 or a corresponding word line 30 to 33.

Further, the gate electrode of each of the first select transistors T20 to T23 and each of the second select transistors T30 to T33 is typically connected with a gate driver circuitry (not shown in FIG. 1) that may form together with the evaluation circuitry 80 at least a part of a temperature measuring circuitry. Accordingly, the temperature at the temperature sensors 500 to 533 may be measured individually using the evaluation circuitry 80 and the gate driver circuitry. In the following, the temperature sensors 500 to 533 are also referred to as individually addressable temperature sensors.

The the evaluation circuitry 80 and/or the gate driver circuitry may be integrated into the semiconductor device 100, for example in a peripheral area of the semiconductor body. Accordingly, no external wiring is required, except for e.g. a serial communication line to the evaluation circuitry 80 and the gate driver circuitry, respectively.

According to an embodiment of a method for operating the power semiconductor device 100, the load current between the first load metallization and the second load metallization is controlled in accordance with a temperature distribution measured using the individually addressable temperature sensors 500 to 533 during device operation.

Controlling the load current may include changing the load current, for example reducing the load current or switching off the semiconductor device 100 when a peak temperature of the measured temperature distribution, an average of the measured temperature distribution, a temperature difference within the measured temperature distribution and/or a temperature difference to a corresponding temperature of a previously measured temperature distribution exceeds a corresponding threshold.

In embodiments referring to power transistors 100, controlling the load current may include changing a distribution of the load current if one or more of the thresholds or a functions of the thresholds are reached or exceeded. For example, a transistor structures may be switched off if an absolute temperature next to the transistor structure exceeds a first threshold and/or if a temperature gradient next to the transistor structure exceeds a second threshold.

In order to allow selective switching-off, the temperature measuring circuitry may form part of a temperature control circuitry connected with gates of additional low-power switching transistors each of which is connected with its source and drain between the gate metallization of the semiconductor device 100 and the a gate electrode of one or several of the (power) transistor structures used for controlling the load current.

The method is typically repeated during normal operation of the power semiconductor device to allow monitoring of the semiconductor device 100 during operation.

Typically, the individually addressable temperature sensors are calibrated prior to measuring the temperature distribution and/or from time to time, respectively. Accordingly, manufacturing tolerances and/or a drift of the temperature sensors during device operation may be compensated.

Depending on operational mode of the semiconductor device 100, the highest temperature may be expected in different locations. Due to measuring a temperature distribution instead of a single value, controlling the load current may be better adapted with the operational modes.

Figure 2:
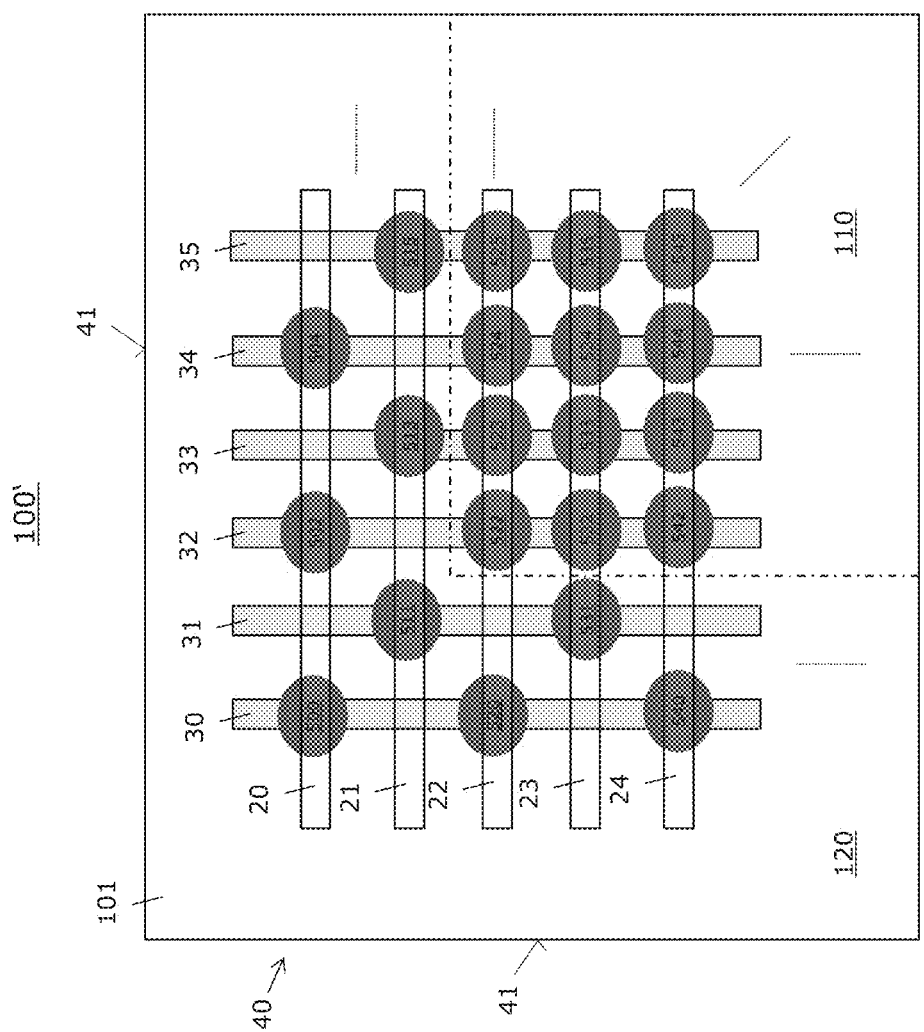
FIG. 2 illustrates a top view on a semiconductor device according to an embodiment.

FIG. 2 illustrates a top view on a corner region of a power semiconductor device 100'. The power semiconductor device 100' is similar to the power semiconductor device 100 explained above with regard to FIG. 1 and includes also an array of temperature sensors 500 to 545 which are arranged on the main surface 101 of the semiconductor body 40 and individually addressable via bit lines 20 to 24 crossing word-lines 30 to 35. However, the number of temperature sensors per area is higher in the active area 110 compared to the peripheral area arranged between the active area 110 and the edge 41 of the semiconductor device 100'. Accordingly, the area-specific density of temperature sensors is higher where a higher power dissipation and thus higher temperatures and higher temperature gradients are to be expected during normal device operation.

As illustrated by the dotted lines, only a portion of the active area 110 and the peripheral area 120 surrounding the active area 110 when seen from above are shown in FIG. 2. The total number of individually addressable temperature sensors may be larger than 100, or 1000 or even larger than 10000. The wiring requirements are comparatively low even for large numbers of temperature sensors. For example, only 200 selection transistors are required for 10000 temperature sensors if the temperature sensors form a quadratic array on the semiconductor body 40.

For sake of clarity, selection transistors, an evaluation circuitry, and/or a gate driver circuitry that may be additionally integrated are not shown in FIG. 2.

Figure 3:
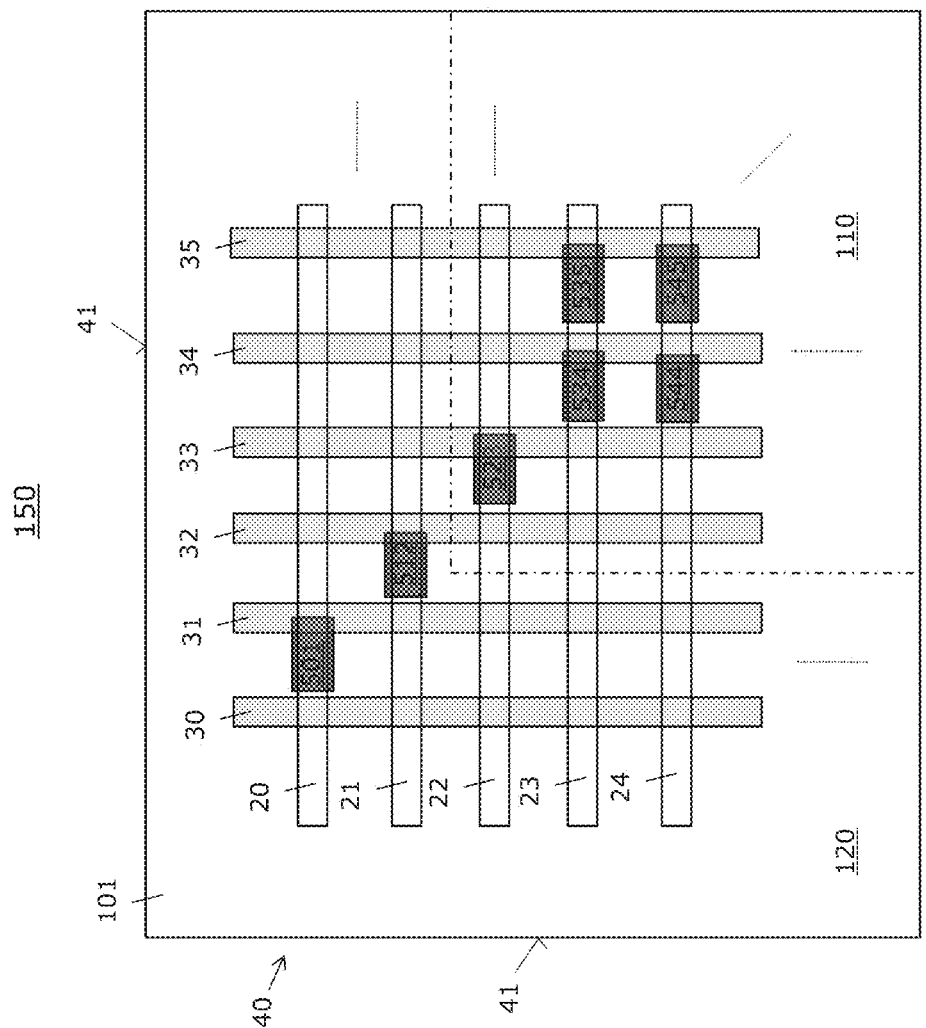
FIG. 3 illustrates a top view on a semiconductor device according to an embodiment.

FIG. 3 illustrates a top view on a corner region of a power semiconductor device 150. The power semiconductor device 150 is similar to the power semiconductor device 100' explained above with regard to FIG. 2 and includes also an array of temperature sensors 501 to 545 which are arranged on the main surface (first surface) 101 of the semiconductor body 40 and individually addressable via bit lines 20 to 24 crossing word-lines 30 to 35. However, the number of temperature sensors per area also varies in the active area 110 of the semiconductor device 150. Accordingly, the array of temperature sensors may be adapted to the expected temperature distribution of the semiconductor device 150.

According to an embodiment, a first number of temperature sensors 523 is arranged in a first part of the active area, and a second number of temperature sensors 534 to 545 is arranged in a second part of the active area, wherein the first number per area is smaller than the second number per area. In FIG. 3, the first part is arranged between the second part (central part) and the peripheral area 120.

As illustrated in FIG. 3, the temperature sensors 501 to 545 may be substantially bar-shaped (band-shaped when seen from above).

Further, the temperature sensors 501 to 545 are typically arranged between the main surface 101 and the bit and word lines 20 to 24, 30 to 35. In this design, the temperature sensors 501 to 545 may be placed close regions of higher heating while the bit lines 20 to 24 and word lines 30 to 35 are spaced apart from the semiconductor body 40 and electrically insulated from the transistor structures and diode structures, respectively, of the active area 110. Accordingly, a high measuring sensitivity and robustness may be achieved. Due to insulating the bit and word lines 20 to 24, 30 to 35 from the transistor structures and diode structures, respectively, the influence of the load current controlled by the power semiconductor device 150 on the temperature measurement is at least kept low.

Figure 4:
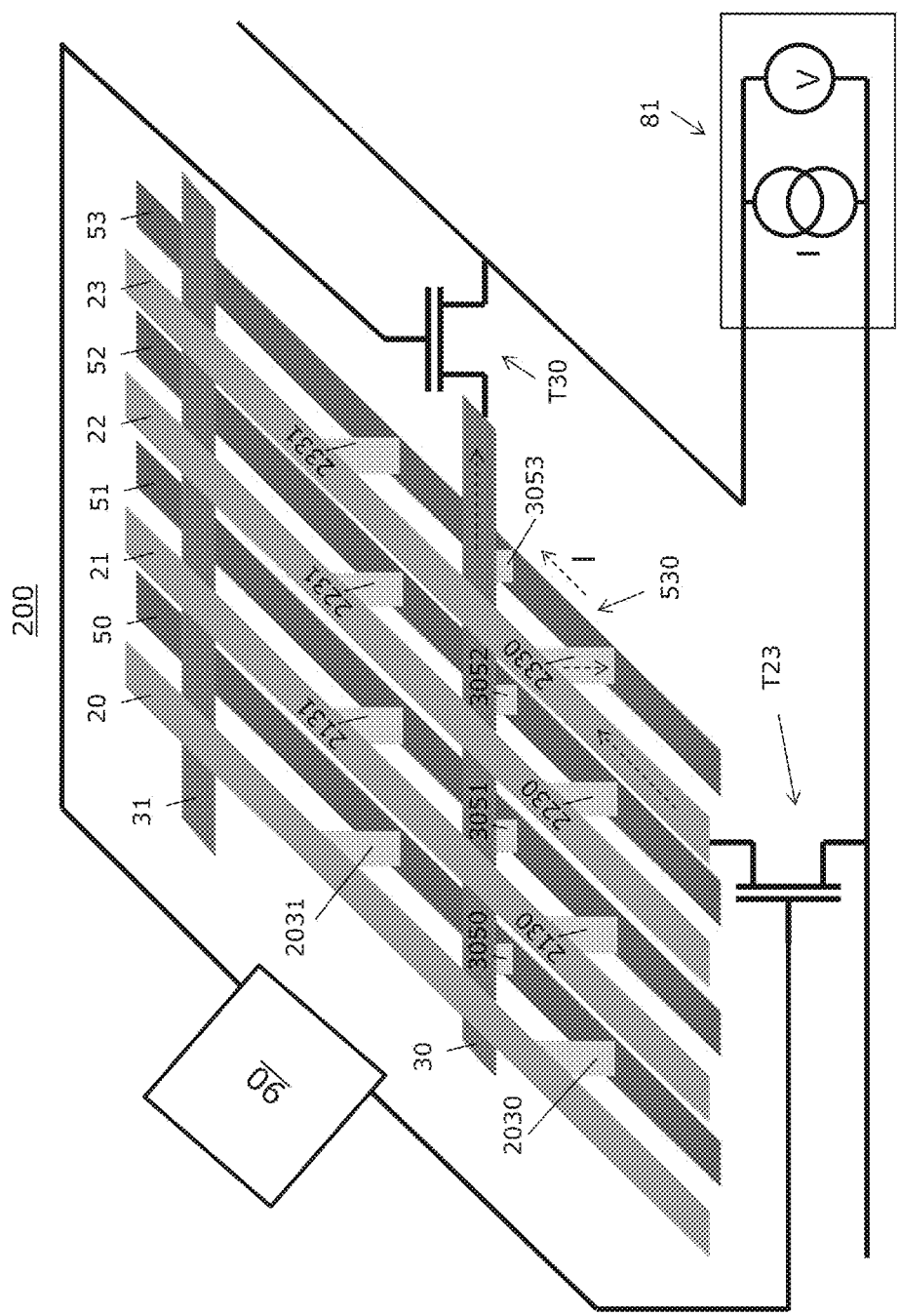
FIG. 4 illustrates a schematic view of a semiconductor device according to an embodiment.

FIG. 4 illustrates a schematic view of a semiconductor device 200. The power semiconductor device 200 is similar to the power semiconductor device 150 explained above with regard to FIG. 3 and includes also an array of temperature sensors which are arranged on the main surface of the semiconductor body (not shown in FIG. 3) of the power semiconductor device 200 and which are individually addressable via bit lines 20 to 23 crossing word-lines 30, 31.

In the exemplary embodiment, the word lines 30, 31 are arranged between the temperature sensors and the bit lines 20 to 23. In another embodiment, the bit lines are arranged between the temperature sensors and the word lines.

As illustrated in FIG. 4, the temperature sensors 530 may be formed by portions 530 of typically substantially bar-shaped temperature sensitive regions 50 to 53 extending substantially parallel to the bit lines 20 to 23. The temperature sensitive regions 50 to 53 are typically made of a non-monocrystalline semiconductor such as of poly-silicon (poly-Si).

In the exemplary embodiment, the each of the temperature sensitive regions 50 to 53 overlaps with a respective bit lines 20 to 23. This facilitates forming first through-contacts 2030, 2031, 2130, 2131, 2230, 2231, 2330, 2331 extending from the bit lines 20 to 23 to the temperature sensitive regions 50 to 53. Each of temperature sensors are formed by a portion of the temperature sensitive regions 50 to 53 between one of the first through-contact 2031 to 2331 and one of the second through-contacts 3050, 3051, 3052, 3035 extending from the word line 30 to the temperature sensitive regions 50 to 53. For sake of clarity, the second through-contacts extending from the word line 31 to the temperature sensitive regions 50 to 53 are not shown in FIG. 4. For the same reason, only the temperature sensor 530 formed between the through-contacts 2330 and 3053 is provided with a reference numeral. Further, FIG. 4 only shows the two selection transistors T23 and T30 which may be used to address the temperature sensor 530 for measurement by are appropriately controlled their gates with the gate driver circuitry 90.

Alternatively, the temperature sensors may be formed by portions of substantially bar-shaped temperature sensitive regions extending substantially parallel to the word lines.

In the exemplary embodiment, the temperature sensors 530 are implanted as resistors. Accordingly, the evaluation circuitry 81 illustrated in FIG. 4 is implemented as impedance measuring circuitry, e.g. measuring the voltage drop V at given current I or vice versa.

The temperature sensors 530 may include or be formed by temperature sensitive element made of poly-silicon forming a temperature dependent resistor of known characteristics.

The evaluation circuitry 81 may be configured to measure a dc-resistance and/or an ac-resistance.

Figure 5:
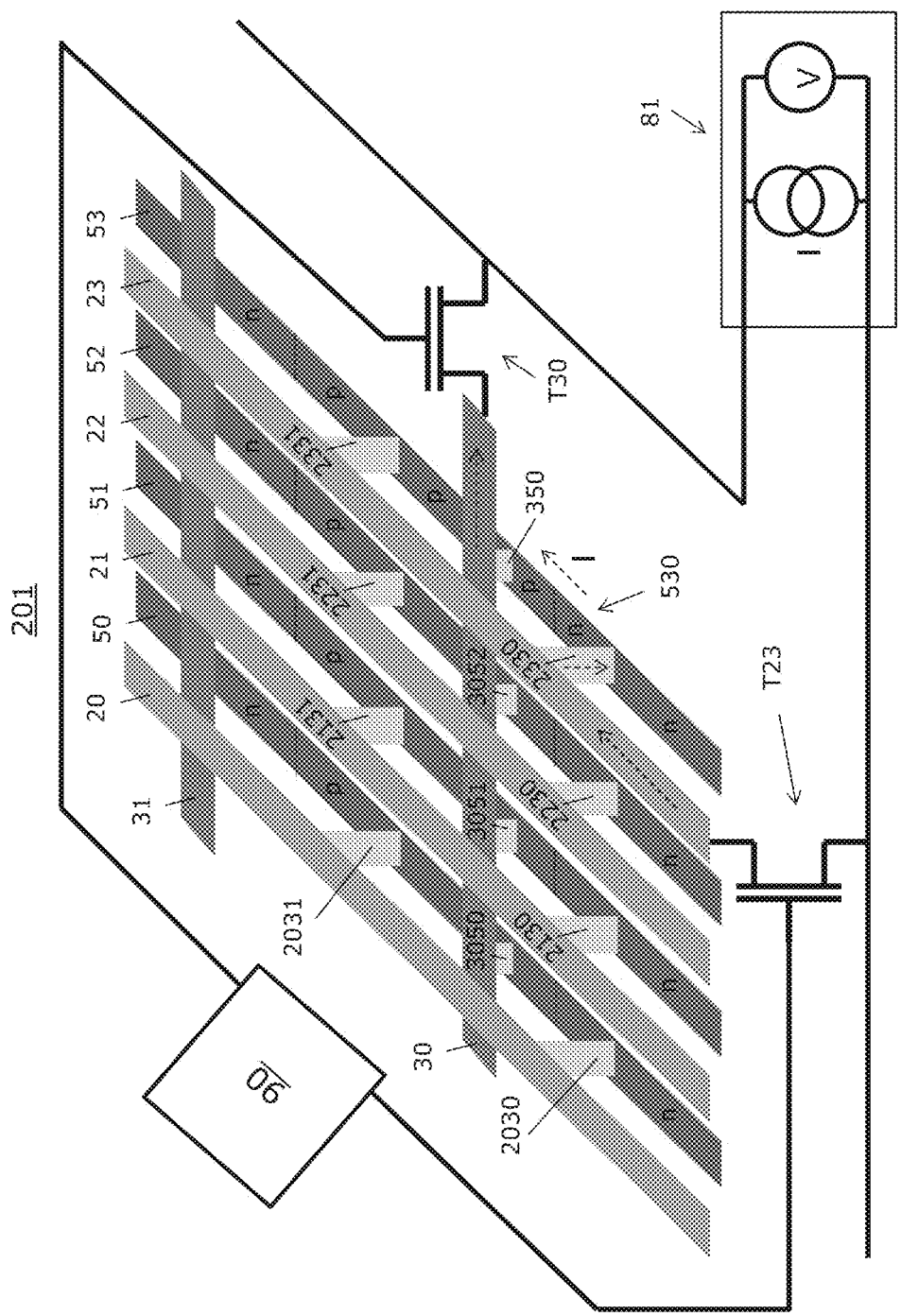
FIG. 5 illustrates a schematic view of a semiconductor device according to an embodiment.

Typically, the evaluation circuitry 81 and the gate driver circuitry 90 are parts of a temperature measuring circuitry or even a temperature control circuitry as explained above with regard to FIG. 1 that may at least in parts be integrated into the semiconductor body of the semiconductor device 200 to allow on-chip temperature measurement and on-chip temperature control, respectively. To compensate manufacturing variations such as thickness or width of the temperature sensitive regions 50 to 53, temperature measuring circuitry may include memory cells for storing temperature sensor specific information FIG. 5 illustrates a schematic view of a semiconductor device 201. The power semiconductor device 201 is similar to the power semiconductor device 200 explained above with regard to FIG. 4. The temperature sensitive element 530 of the temperature sensors of semiconductor device 202 may also be formed by respective portions 530 of poly-Si or another non-monocrystalline semiconductor region. However, the temperature sensitive sensors 530 are implemented as diodes and the temperature measurement is based on the voltage dependency of the threshold voltage of the pn-junction of the diodes.

The semiconductor device 100 to 202 explained above with regard to FIGS. 1 to 5 have in common that the crossing word lines and the bit lines are separated from the temperature sensors and each other, typically by respective dielectric layers. The semiconductor body 40 of the semiconductor device 100 to 202 typically includes a first surface 101, an edge 41 delimiting the semiconductor body in a horizontal direction substantially parallel to the first surface 101, an active area 110 including several transistor structures connected in parallel and/or several diode structures connected in parallel, and a peripheral area 120 arranged between the active area 110 and the edge 41. The semiconductor device 100 to 202 further include a plurality of word lines, a plurality of bit lines which are separated from the word lines, and cross the bit lines when seen from above, and a plurality of temperature sensors which are arranged on or at the first surface, wherein each of the temperature sensors is connected with one of the bit lines and one of the word lines.

Figure 6:
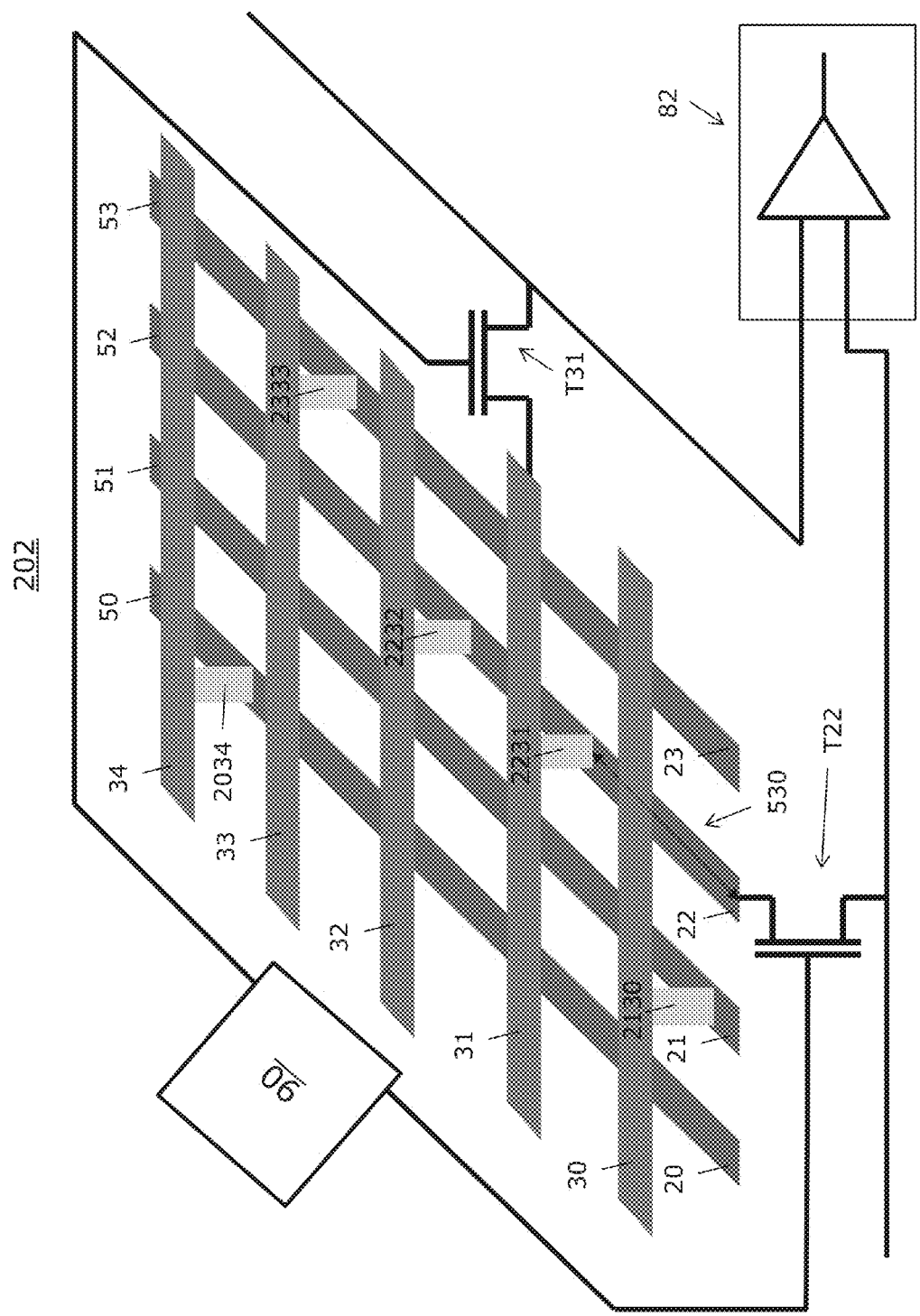
FIG. 6 illustrates a schematic view of a semiconductor device according to an embodiment.

FIG. 6 illustrates a schematic view of a semiconductor device 202. The power semiconductor device 202 is similar to the power semiconductor device 200 explained above with regard to FIG. 4. However, the temperature sensors of semiconductor device 202 employ the Seebeck-effect. In the exemplary embodiment of FIG. 6, the temperature sensitive elements 530 of the temperature sensors of semiconductor device 201 are formed by respective portions 530 of the bit lines 20 to 23 made of a thermoelectric material such as poly-Si or another non-monocrystalline semiconductor region 50 to 53. As indicated by the dotted arrow, a Seebeck-voltage may be measured between the through contact 2231 connecting the bit line 22 and the word line 31 (connected to the second select transistor T31) and a further through contact (not shown in FIG. 6) for connecting the first select transistor T22 with the bit line 22. Accordingly, the evaluation circuitry 82 typically includes a voltage measurement circuitry as indicated by the operational amplifier in FIG. 6. Due to the comparatively large Seebeck-coefficients of semiconductor materials, semiconductor materials such as poly-Si are particularly well suited for temperature measurements.

The word lines 30, 31 as well as the through contacts 2034, 2130, 2231, 2232, 2333 are typically made of a metal such as tungsten to facilitate reading out the thermoelectric voltages of the temperature sensitive elements 530. Typically, there is only one through contact per word line (metal line) while several through contacts may contact one bit line with different word lines as shown in FIG. 6 for the bit line 22 and the word lines 31, 32.

In another embodiment, the temperature sensitive elements are formed by portions of the word lines 30 to 34.

In other embodiments, two different materials may be used for the temperature sensitive elements 530.

In one embodiment, the power semiconductor device 202 includes a semiconductor body including a first surface, an edge delimiting the semiconductor body in a horizontal direction substantially parallel to the first surface, an active area including several transistor structures connected in parallel and/or several diode structures connected in parallel, and a peripheral area arranged between the active area and the edge. The power semiconductor device 202 further includes a plurality of bit lines arranged on or at the first surface, and a plurality of word lines which are separated from the bit lines, cross the bit lines when seen from above, and are arranged on or at the first surface, so that a plurality of temperature sensors are formed on or at the first surface each of which is formed by a respective portion of one of the bit lines or one of the word lines. For example, the bit lines may be formed as poly-Si stripes or bars and the word lines may be formed metal stripes or bars (or vice versa).

Since the thermoelectric voltage is a measure for a temperature difference, the evaluation circuitry 82 may be configured to measure both thermoelectric voltages and a resistance (typically an ac-resistance). Accordingly, information about the temperature and the temperature gradient may be obtained for the temperature sensors 530.

Figures 7A, 7B:
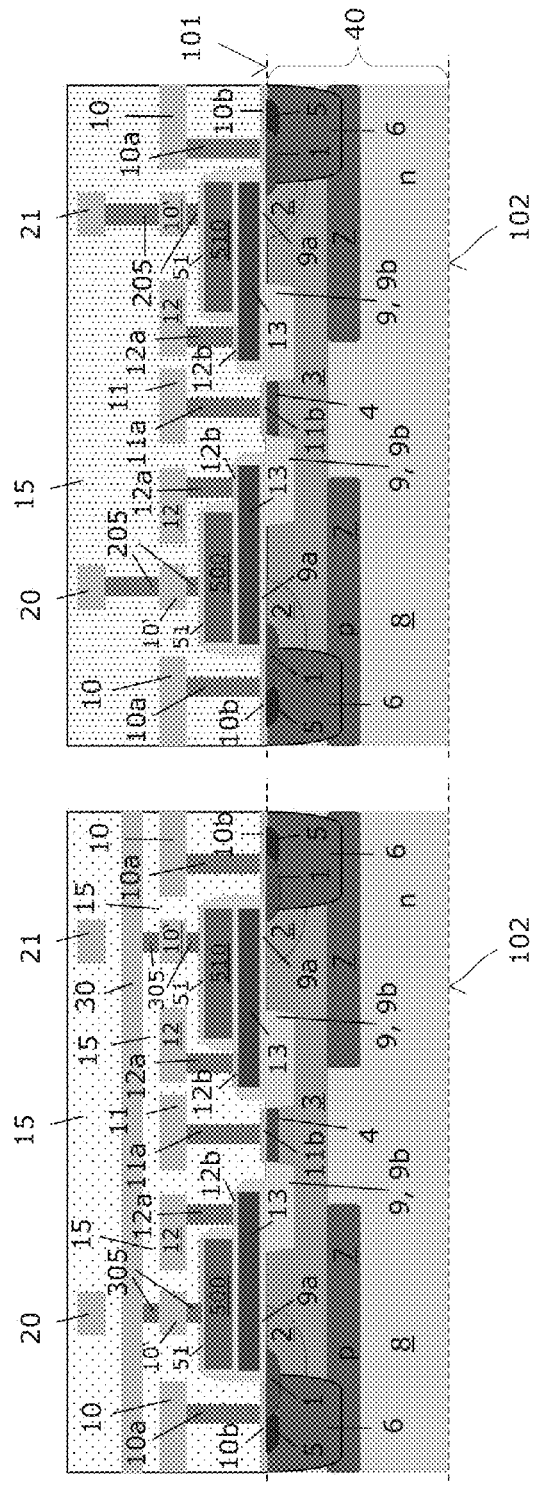
FIG. 7A illustrates a vertical cross-section through a semiconductor device according to an embodiment.
FIG. 7B illustrates a further vertical cross-section through the semiconductor device illustrated in FIG. 7A according to an embodiment.

With reference to FIGS. 7A and 7B, a further embodiment of a power semiconductor device 300 is explained. FIGS. 7A and 7B show two vertical cross-sections through a semiconductor body 40 of the semiconductor device 300. The two vertical cross-sections correspond to sections of the active area 110 and may be parallel to each other. The semiconductor body 40 extends between a main surface 101 which has a normal direction defining a vertical direction and a second surface 102 which is arranged opposite to the main surface 101. In the following, the main surface 101 is also referred to as the main horizontal surface. Neither the edge delimiting the semiconductor body 40 in horizontal direction and typically extending in vertical direction between the first and the second surface 101, 102, nor a peripheral area typically arranged between the active area 110 and the edge and surrounding the active area 110 when seen form above are shown in FIGS. 7A, 7B.

In the illustrated embodiment, the semiconductor device 300 is implemented as a lateral MOSFET. In this embodiment, a first load metallization 10 forming a source metallization, a second load metallization 11 forming a drain metallization, and a gate metallization 12 are typically arranged on the main surface 101 and insulated from each other.

In another embodiment, the semiconductor device 300 forms an IGBT. In this embodiment, the first load metallization 10 forms an emitter metallization and the second load metallization 11 forms a collector metallization.

Note that the cross-section illustrated in FIGS. 7A and 7B may only correspond to a section of a more complex semiconductor device, for example an integrated semiconductor device which includes in a peripheral area further semiconductor structures such as selection transistors and analog or digital measuring or control structures as explained above with regard to FIGS. 1 to 6.

The first load metallization 10 is in low resistive contact with a first contact region 1 of a first conductivity type which is arranged next to the main surface 101. A body region 2 of a second conductivity type adjoins the first contact region 1 and forms with the first contact region 1 a first pn-junction which extends to the main surface 101. A drift region 3 of the first conductivity type adjoins the body region 2 and forms with the body region 2 a second pn-junction which extends to the main surface 101. The second load metallization 11 is in low resistive contact with a second contact region 4 of a second conductivity type which is arranged next to the main surface 101 and has a higher maximum doping concentration than the drift region 1.

In the exemplary embodiment, the first contact region 1, the second contact region 4, the body region 2 and the drift region 3 extend to the main surface 101.

The second contact region 4 may be of the first conductivity type and form a drain region of a lateral MOSFET-structure. In this embodiment, the first contact region 1 forms a source region.

Alternatively, the second contact region 4 is of the second conductivity type and forms a collector region of a lateral IGBT-structure. In this embodiment, the first contact region 1 forms an emitter region.

Typically, the semiconductor device 300 includes a plurality of unit cells as illustrated in FIGS. 7A, 7B which are connected to common load metallizations 10, 11 and a common gate metallization 12. Accordingly, the semiconductor device 300 includes a plurality of transistor structures connected in parallel. In other embodiments, the semiconductor device includes plurality of diode structures connected in parallel between the common load metallizations 10, 11.

Furthermore, a field-stop region of the first conductivity type having a higher maximum doping concentration than the drift region 3 may be arranged between the second contact region 4 and the drift region 3.

An electrode 13 is arranged on the main surface 101 and insulated from the semiconductor body 40 by an insulating structure 9. The electrode 13 is in low resistive electric contact with the gate metallization 12. In the exemplary embodiment, the electrode(s) 13 is electrically connected with the gate metallization 12 by through contacts 12a which extend through an interlayer dielectric 15 arranged on the main surface 101, and an optional contact layer 12b of e.g. tungsten. The interlayer dielectric 15 may be made of any suitable dielectric material such as silicon oxide ($SiO_2$), silicon nitride ($SiN$) and silicon oxynitride ($SiO_xN_y$), TEOS (TetraEthylOrthoSilicat), USG (Undoped Silicate Glass), an HDP-oxide (High Density Plasma-oxide) or a doped oxide, for example PSG (PhosphoSilicate Glass), BPSG (BoroPhosphoSilicate) or BSG (BoroSilicate Glass).

In the exemplary embodiment, each of the illustrated electrodes 13 has a first portion which extends, in a horizontal direction, from the first contact region 1 along the body region 2 and at least to the drift region 3, and second portion which adjoins the first portion, is arranged above the drift region 3 and spaced apart from the body region 2. The corresponding insulating structure 9 has a gate dielectric portion 9a which is arranged between the semiconductor body 40 and the first portion of electrode 13 forming a gate electrode, and a field dielectric portion 9b which adjoins the gate dielectric portion 9a and is arranged between the drift region 3 and the second portion of electrode 13 forming a field electrode.

The gate dielectric portion 9a is arranged on the main surface 101 and extends in the horizontal direction at least between the first and second pn-junctions. Accordingly, a channel region may be formed in an adjoining portion of the body region 2 by applying an appropriate voltage difference between the gate metallization 12 and the first load metallization 10.

The field dielectric portion 9b extends along and into the drift region 3 and has a higher vertical extension compared to the gate dielectric portion 9a. Accordingly, the breakdown voltage of semiconductor device 100 is typically increased.

Typically, the insulating structure 9a, 9b is formed by a contiguous dielectric region 9. Dielectric region 9 may be made of any suitable dielectric material such as silicon oxide ($SiO_2$), silicon nitride ($SiN$) and silicon oxynitride ($SiO_xN_y$) but may also be made of high-dielectric constant materials such as hafnium oxide ($HfO$) or the like.

Typically, the body region 2 is also in low resistive electric contact with the first load metallization 10 to avoid latch-up. In the exemplary embodiment, this is provided via a highly doped body contact region 5 of the second conductivity type and a deep body connection region 6 of the second conductivity type which may have a maximum doping concentration between a maximum doping concentration of the body region 2 and a maximum doping concentration of the body contact region 5. Furthermore, a deep body region 7 having a higher maximum doping concentration than the body region 2 may adjoin and be arranged below the body region 2 and the deep body connection region 6.

In the exemplary embodiment, the first contact region 1 and the body contact region 5 are in Ohmic contact with the first load metallization 10 via through contacts 10a, which extend through the interlayer dielectric 15, and an optional contact layer 10b. Likewise, the second contact region 4 is in Ohmic contact with the second load metallization 11 via through contacts 11a, which extend through the interlayer dielectric 15, and an optional contact layer 11b. As illustrated in FIGS. 7A, 7B, the first and second load metallizations 10, 11 may be manufactured by structuring a common metal layer.

When seen from above, the electrode 13 typically overlaps with the first contact region 1, the body region 2, the drift region 3, the gate dielectric portion 9a, the field dielectric portion 9b, and the deep body connection region 6.

According to an embodiment, a plurality of temperature sensors 500, 510 are above the main surface 101 and contacted to bit lines 20, 21 and word line(s) 30 arranged above the temperature sensors 500, 510. Due the illustrated small section, only two temperature sensors 500, 510, one word line 30 and two bit lines 20, 21 are shown in FIGS. 7A, 7B. When seen from above, the layout of temperature sensors 500, 510, word line(s) 30 and bit lines 20, 21 is typically similar as and may even correspond to the layouts illustrated in FIGS. 4 to 6.

As explained above with regard to FIGS. 1 to 6, each of the temperature sensors 500, 510 is connected with one of the word line(s) 30 and one of the bit lines 20, 21.

In the exemplary embodiment, the temperature sensors 500, 510 are connected with the bit lines 20, 21 (FIG. 7B) and word line 30 (FIG. 7A) by respective through contacts 205, 305, which extend through the interlayer dielectric 15, remaining portions 10' of the common metal layer and respective optional contact layers 51.

Due locating the temperature sensors 500, 510 close to a respective gate electrode 13 and channel region of the corresponding transistor structure, respectively, the temperature may be measured where higher values are expected and any temperature change may be measured with short delay only. Since the temperature sensors 500, 510 and word and bit lines 20, 21, 30 are insulated from the transistor structures of the power semiconductor device 300 any cross-talk is at least substantially reduced.

In a horizontal direction perpendicular to the cross-sections illustrated in FIGS. 7A, 7B, the temperature sensors 500, 510 may be formed by portions of substantially bar-shaped elongated regions 500, 510 overlapping at least partially with respective gate electrodes 13 when seen from above.

Typically, the temperature sensors 500, 510 are made of poly-Si. In this embodiment, the optional contact layers 51 may e.g. be made of tungsten.

As explained above, poly-Si is well suited for forming sensitive temperature sensors. Further, poly-Si is a standard material in semiconductor technology. Accordingly, manufacturing of the temperature sensor array on the main surface 101 is facilitated.

Figure 8A:
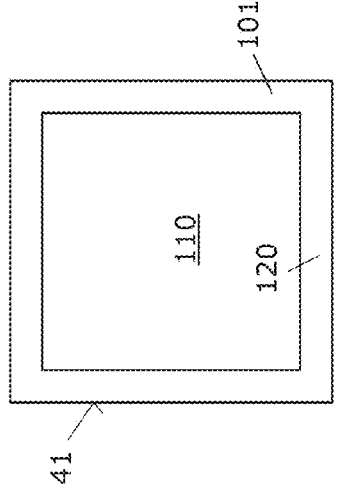
FIGS. 8A to 8D illustrate top views on a semiconductor wafer during method steps of a method according to embodiments.
Figure 8B:
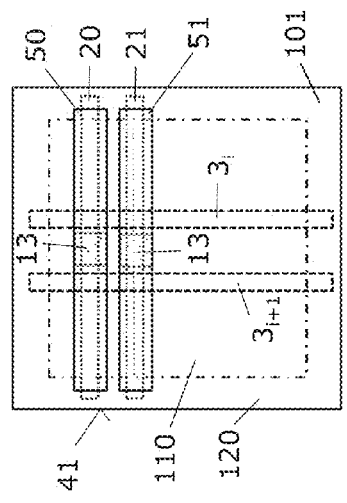

FIGS. 8A to 8B illustrate a method for forming the semiconductor device 300 according to several embodiments. In a first step, a wafer 400 having a first surface 101, e.g. a Si-wafer, is provided.

Thereafter, an active chip area 110 and a peripheral chip area 120 surrounding the active chip area are defined for each power semiconductor device 300 to be manufactured. For sake of clarity, this is illustrated in FIGS. 8A, 8B for only one semiconductor device 300 (portion 40' of the wafer 400) of typically a plurality of semiconductor device 300 to be manufactured in parallel on wafer-level.

Thereafter, a plurality of transistor structures (and/or a plurality of diode structures) may be formed in the active chip area 110 of semiconductor device 300.

Figure 8C:
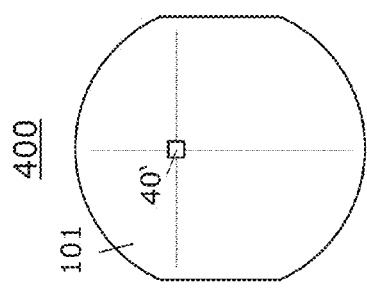

As illustrated in FIG. 8C, each of the transistor structures typically includes a gate electrode 13 arranged next to the first surface 101, e.g. on the first surface as illustrated in FIGS. 7A, 7B. In other embodiments the gate electrodes are implemented as trench-gate electrodes. For sake of clarity, only two gate electrodes 13 of typically a plurality of gate electrodes forming an array are shown in FIG. 8C.

Thereafter, a plurality of temperature sensors may be formed on the first surface 101. This may include forming substantially bar-shaped poly-silicon regions 50, 51 above the plurality of semiconductor transistor structures such that the substantially bar-shaped poly-silicon regions 50, 51 overlap with one or more semiconductor transistor structures, typically with several of the respective gate electrode 13, and are insulated from the transistor structures, typically by a dielectric layer.

Figure 8D:
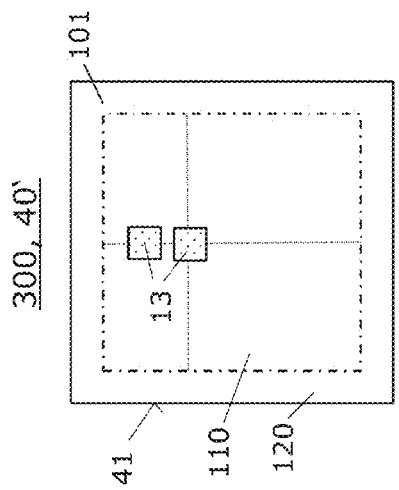

Thereafter, a first load metallization (10 not shown in FIG. 8D) in ohmic contact with the transistor structures, a second load metallization (11) in ohmic contact with the transistor structures and a gate metallization (12 not shown in FIG. 8D) in Ohmic contact with the gate electrodes 13 may be formed on the first surface 101. The first load metallization, the second load metallization and the gate metallization may be formed by structuring one metallization layer formed above the first surface 101 and the gate electrodes 13. In embodiments referring to vertical power semiconductor devices, the second load metallization is formed opposite to the first load metallization.

Thereafter, bit lines 20, 21 and word lines $3_i$, $3_{i+1}$, typically orthogonally crossing each other, may be formed on the first surface 101 and over each other so that each of the temperature sensors is connected with one of bit lines 20, 21 and one word lines $3_i$, $3_{i+1}$.

In embodiments referring to power semiconductor devices with Seebeck-temperature sensors, the bit lines or the word lines are already formed during forming the substantially bar-shaped poly-silicon regions 50, 51. Accordingly, forming the temperature sensors 5xy and forming the bit lines (or word lines) includes a common step of forming substantially bar-shaped poly-silicon regions above the plurality of semiconductor transistor structures (and/or diode structures).

In embodiments referring to vertical power semiconductor devices, the bit lines 20, 21 and word lines $3_i$, $3_{i+1}$ are typically formed prior to forming the second metallization.

Thereafter, the wafer 400 may be singulated (e.g. diced) into individual chips 300.

Typically prior to forming the bit lines 20, 21 and word lines $3_i$, $3_{i+1}$, first and second select transistors, a gate driver circuitry connected with a respective gate electrode of each of the first and second select transistors, an evaluation circuitry connected with a respective source electrode or drain electrode of each of the first and second select transistors, and/or even a complete temperature measuring circuitry or even a temperature control circuitry may be formed in the peripheral chip area. In this embodiment, the manufacturing process if performed such that each of the first and second select transistors is connected with one of the bit lines 20, 21 and one of the word lines $3_i$, $3_{i+1}$.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body comprising:
        a first surface;
        an edge delimiting the semiconductor body in a horizontal direction substantially parallel to the first surface;
        an active area comprising at least one of several transistor structures connected in parallel and several diode structures connected in parallel; and
        a peripheral area arranged between the active area and the edge;
    a plurality of bit lines;
    a plurality of word lines separated from the bit lines; and
    a plurality of temperature sensors arranged on or at the first surface, wherein each of the temperature sensors is connected with one of the bit lines and one of the word lines, or each of the temperature sensors is formed by a respective portion of one of the bit lines.

2. The power semiconductor device of claim 1, wherein at least one of the bit lines and the word lines are arranged on the first surface.

3. The power semiconductor device of claim 1, wherein each of the bit lines is connected with a respective first select transistor formed in the peripheral area, and wherein each of the word lines is connected with a respective second select transistor formed in the peripheral area.

4. The power semiconductor device of claim 3, further comprising gate driver circuitry connected with a respective gate electrode of each of the first select transistors and a respective gate electrode of each of the second select transistors.

5. The power semiconductor device of claim 3, further comprising evaluation circuitry connected with a respective source electrode or drain electrode of each of the first select transistors and with a respective source electrode or a respective drain electrode of each of the second select transistors.

6. The power semiconductor device of claim 1, wherein the transistor structures are insulated from the bit lines and the word lines, or the diode structures are insulated from the bit lines and the word lines.

7. The power semiconductor device of claim 1, wherein at least one of the temperature sensors is arranged close to a gate electrode of one of the transistor structures.

8. The power semiconductor device of claim 1, wherein at least one of the temperature sensors comprises a temperature sensitive element comprising poly-silicon.

9. The power semiconductor device of claim 1, wherein at least one of the temperature sensors comprises a temperature sensitive element comprising two different materials.

10. The power semiconductor device of claim 1, wherein at least some of the temperature sensors are resistors.

11. The power semiconductor device of claim 1, wherein at least some of the temperature sensors are diodes.

12. The power semiconductor device of claim 1, wherein the temperature sensors comprise portions of substantially bar-shaped poly-silicon regions extending substantially parallel to the bit lines or the word lines, or the temperature sensors comprise substantially bar-shaped poly-silicon portions of the bit lines.

13. The power semiconductor device of claim 1, wherein a first number of the temperature sensors is arranged in a first part of the active area, wherein a second number of the temperature sensors is arranged in a second part of the active area, and wherein the first number per area is smaller than the second number per area.

14. A method for operating a power semiconductor device comprising a first load metallization, a second load metallization, a plurality of individually addressable temperature sensors, and a semiconductor body having a first surface and comprising at least one of a plurality of transistor structures connected in parallel between the first load metallization and the second load metallization and a plurality of diode structures connected in parallel between the first load metallization and the second load metallization, the method comprising:
    measuring a temperature distribution using the individually addressable temperature sensors; and
    controlling a load current between the first load metallization and the second load metallization in accordance with the measured temperature distribution,
    wherein the power semiconductor device further comprises a plurality of bit lines and a plurality of word lines separated from the bit lines,
    wherein the plurality of temperature sensors is arranged on or at the first surface, and
    wherein each of the temperature sensors is connected with one of the bit lines and one of the word lines, or each of the temperature sensors is formed by a respective portion of one of the bit lines.

15. The method of claim 14, further comprising calibrating at least one of the individually addressable temperature sensors prior to measuring the temperature distribution.

16. The method of claim 14, wherein the method is repeated during normal operation of the power semiconductor device.

17. The method of claim 14, wherein controlling the load current comprises at least one of:
    changing the load current;
    changing a distribution of the load current;

switching-off at least one of the transistor structures if an absolute temperature next to the at least one of the transistor structure exceeds a first threshold; and switching-off at least one of the transistor structures if a temperature gradient next to the at least one of the transistor structure exceeds a second threshold.

18. A method for manufacturing a power semiconductor device, the method comprising:

providing a semiconductor wafer having a first surface;

defining an active chip area and a peripheral chip area surrounding the active chip area;

forming in the active chip area at least one of a plurality of transistor structures and a plurality of diode structures;

forming a plurality of temperature sensors on the first surface;

forming on the first surface a first load metallization in ohmic contact with the transistor structures and/or the diode structures;

forming a second load metallization in ohmic contact with the transistor structures and/or the diode structures;

forming a plurality of bit lines on the first surface; and forming a plurality of word lines on the first surface, so that each of the temperature sensors is connected with one of the bit lines and one of the word lines, or that each of the temperature sensors is formed by a respective portion of one of the bit lines.

19. The method of claim 18, further comprising at least one of:

forming in the peripheral area first select transistors each of which is connected with one of the bit lines;

forming in the peripheral area second select transistors each of which is connected with one of the word lines;

forming in the peripheral area gate driver circuitry connected with a respective gate electrode of each of the first select transistors and with a respective gate electrode of each of the second select transistors; and forming in the peripheral area evaluation circuitry connected with a respective source electrode or a respective drain electrode of each of the first select transistors and the second select transistors.

20. The method of claim 18, wherein forming the plurality of temperature sensors comprises forming substantially bar-shaped poly-silicon regions above the plurality of transistor structures such that at least a majority of the substantially bar-shaped poly-silicon regions overlaps at least partially with one or more of the transistor structures, or wherein forming the plurality of temperature sensors and forming the plurality of bit lines comprises forming substantially bar-shaped poly-silicon regions above the plurality of transistor structures.

* * * * *